Sept. 29, 1953 G. B. LOPER Re. 23,716

ELECTRON BEAM VACUUM TUBE

Original Filed March 20, 1946

INVENTOR.
GEORGE B. LOPER
BY
Sidney A. Johnson
ATTORNEY

Reissued Sept. 29, 1953 Re. 23,716

UNITED STATES PATENT OFFICE 23,716

ELECTRON BEAM VACUUM TUBE

George B. Loper, Dallas, Tex., assignor, by mesne assignments, to Socony-Vacuum Oil Company, Incorporated, New York, N. Y., a corporation of New York Original No. 2,545,822, dated March 20, 1951, Serial No. 655,664, March 20, 1946. Application for reissue September 13, 1951, Serial No. 246,494

11 Claims. (Cl. 313—80)

Matter enclosed in heavy brackets [ ] appears in the original patent but forms no part of this reissue specification; matter printed in italics indicates the additions made by reissue.

The present invention relates to a vacuum tube, and more particularly to a vacuum tube structure which provides a variable mu constant average anode current characteristic.

In seismic prospecting systems, the amplifier is set for maximum gain so that the direct seismic wave produced by a charge of explosive in a shot hole produces a sharp break in the seismogram as a result of the initial movement of the oscillographic element. The sharp break in the seismogram thus produced by the high gain of the amplifier eliminates the necessity of estimating the precise instant at which the oscillographic element first began to move. Subsequently, the gain of the amplifier is reduced to a relatively low level for the reception of an initial series of reflected waves which are of higher amplitude than succeeding waves. In the application of gain control to such amplifiers and seismographic systems, it has been found that the change of the gain of the amplifier introduces a corresponding modulation or distortion of the seismic wave signals transmitted. In the application of gain control to amplifiers in radio receivers, the audio or radio frequencies of the signals are relatively high compared to the low frequency of the automatic gain control voltage. In seismographic recording, the seismic signals are relatively low in frequency and have a frequency comparable to that of the gain control voltage. In radio receivers, a simple filter arrangement will substantially eliminate the unwanted gain control signal from the output, but such simple filter circuits will not eliminate the undesired gain control signal effect on the amplifier output in a seismographic apparatus.

In amplifiers of the type under consideration having circuits which are commonly of the resistance-capacitance coupled type, the change in gain or signal control introduces modulation of the signal by the change of potential of the interstage coupling capacitor. When the gain of the amplifier is sharply reduced, the voltage of the anode circuit changes potential with regard to ground due to the sudden plate current reduction through the anode impedance or resistor. This produces a change of potential upon the coupling capacitor which then is charged through the grid coupling resistor of the succeeding stage. This charging of the coupling capacitor through the resistor of the succeeding stage drives the grid of the succeeding vacuum tube sufficiently away from normal bias as to introduce distortion and in some instances to substantially block the transmission signals.

If the change in gain control produced no appreciable change in the anode current, the coupling capacitor would be maintained at a substantially constant average potential throughout all gain variations. This condition may be obtained in accordance with the present invention by the construction of a vacuum tube having a variable mu substantially constant anode current characteristic.

It is therefore an object of the present invention to provide an improved vacuum tube for amplifiers which does not introduce into the signal output any components corresponding to the gain control voltage.

It is a further object of the present invention to provide an improved vacuum tube of the electron beam type having a variable mu constant average anode current characteristic.

Other and further objects of the present invention subsequently will become apparent by reference to the following description taken in conjunction with the accompanying drawing in which:

Fig. 1 diagrammatically illustrates the internal construction of one form of vacuum tube having the desired characteristics;

Figure 1:
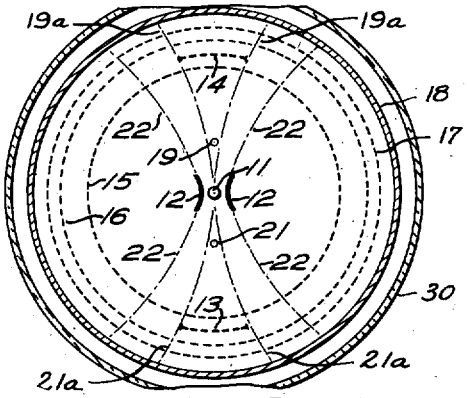

The vacuum tube having the characteristic of a constant plate current irrespective of the gain control voltage applied thereto is diagrammatically illustrated in Fig. 1. This vacuum tube has a cathode 11 which has on either side electron beam forming plates 12 so as normally to direct electron beams in opposite directions toward a pair of grids 13 and 14. The grids are surrounded by *a pair of circumferentially continuous* concentric screen grid structures 15 and 16. A cylindrical suppressor grid 17 is interposed between the screen grid 16 and a cylindrical anode 18 enclosed in a glass envelope 30. Positioned between the signal or control grids 13 and 14 and the cathode 11 are a pair of gain control rods 19 and 21. When there is no potential applied to the gain control rods 19 and 21 the electron beam 22 will impinge upon the control grids 13 and 14. When, however, a negative potential is applied to the control rods 19 and 21 the electron beams are deflected to either side so that the gain control rods 19 and 21 cast an electron shadow upon the signal grids 13 and 14. Dependent upon the magnitude of the potential applied to the gain control rods 19 and 21, the size of the shadow will change so that a greater or lesser amount of the energy of the electron beam 22 reaches the signal grids 13 and 14.

The electron beam 22 is not appreciably diminished by potentials appearing upon the gain control rods 19 and 21 so that the number of electrons reaching the anode 18 remain constant, thereby providing a constant plate current characteristic. The variation of potential on the gain control rods 19 and 21, however, varies the grid plate transconductance so that the vacuum tube has a variable mu characteristic. By proper design, the gain control rods 19 and 21 may be positioned so that with a certain negative bias thereon practically none of the electrons of the electron beam 22 will reach the signal grids 13 and 14, thus making it possible to control the signal output of the vacuum tube between a maximum value and a minimum value which is substantially zero.

Figure 2:
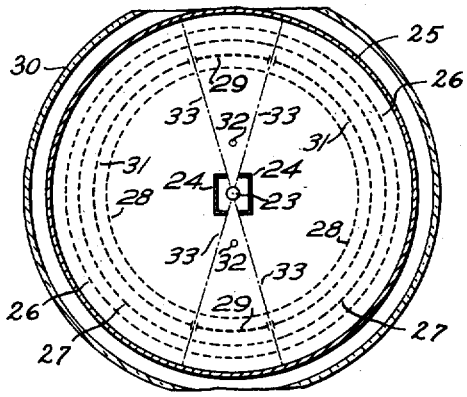
Fig. 2 is another diagrammatic representation of a suitable form of vacuum tube having the desired operating characteristics.
Figure 3:
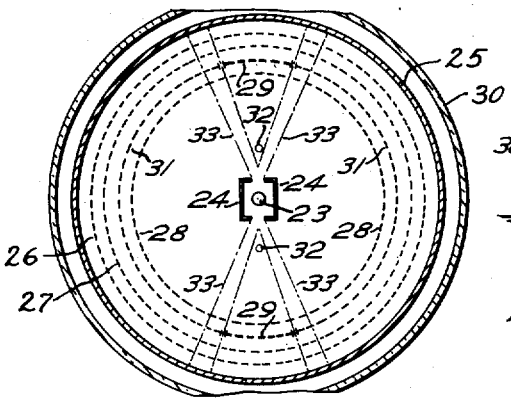
Fig. 3 is another view similar to Fig. 2 illustrating the operation of the vacuum tube under different conditions.

Figs. 2 and 3 show another construction of a vacuum tube having a variable mu constant anode current characteristic. This structure of the vacuum tube has a cathode 23 partially surrounded by an electron beam forming structure 24 which permits electron beams to move in two opposite directions toward a cylindrical anode 25. Adjacent the cylindrical anode 25 there is provided a suppressor grid 26. Two screen grid structures 27 and 28 [are] provide[d] *a screened zone* for a set of signal grids and a set of non-signal grids. Between the screen grid structures 27 and 28 in the path of the electron beams, there are located a pair of signal grids 29. In the same radius of the signal grids 29, there are located a pair of non-signal grids 31. Between the signal grids 29 and the cathode 23, there are located two gain control rods 32. When there is no potential applied to the rods 32 relative to the cathode 23, the electron beams 33 cover the signal grids 29 and pass on to the anode 25. When a sufficiently negative potential is applied to the gain control rods 32, the electron beams 33 will become forked or bifurcated as illustrated in Fig. 3 so that substantially no electron beam energy impinges upon the signal grids 29. The non-signal grids 31, however, are in the path of the portions of the electron beam 33 so that the electrical and mechanical impedance presented to the electron beam under the condition of a negative potential upon the gain control rods 32 is the same as under the conditions represented by Figure 2. Thus, the impedance presented to the electron beams does not change under different conditions of gain control so that the anode current is constant.

Figure 4:
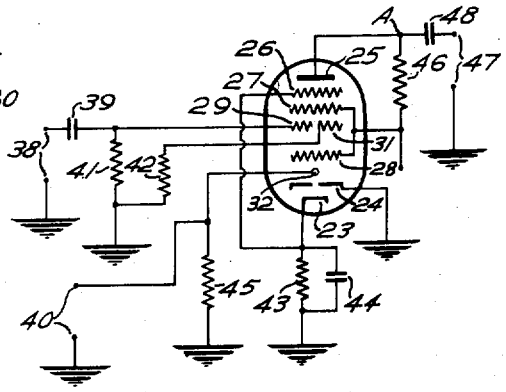
Fig. 4 is a circuit diagram of an amplifier utilizing a vacuum tube having a construction of the type shown in Figs. 2 and 3.

A suitable circuit for the vacuum tube of the type illustrated in Figs. 2 and 3 is shown in Fig. 4. A pair of input terminals 38 are provided for the reception of seismic wave signals such as obtained from a suitable source which might be a geophone. One of the terminals 38 is grounded and the other terminal is connected to a coupling capacitor 39 which is connected to a signal grid 29. The signal grid 29 is provided with a grid coupling resistor 41 which is connected to ground. The non-signal grid 31 is provided with a similar grid coupling resistor 42 also connected to ground. The cathode of the vacuum tube may be self-biased by a resistor 43 which is by-passed by a capacitor 44. The electron beam forming element or structure 24 is connected to ground. The gain control electrodes or rods 32 are connected to ground through a resistor 45 to which may be applied the gain control voltage obtained from a suitable source 40. The screen grid structures 27 and 28 are connected to a suitable source of potential. The suppressor grid 26 is connected to the cathode 23 of the vacuum tube. The anode of the vacuum tube 25 is connected to the source of potential through an anode coupling resistor 46. Suitable output terminals 47 are provided, one of which is connected to the anode of the vacuum tube by a capacitor 48.

In the circuit shown in Fig. 4, the coupling point A which is the juncture between the anode resistor 46 and the coupling capacitor 48 remains at a constant average potential irrespective of the gain control signal applied to the resistor 45. In the circuits heretofore employed in amplifiers, a variation of the gain control voltage on an electrode of the conventional vacuum tube had the effect of changing the anode current so that the potential at the point A changed appreciably. This change in the potential at the point A would require a charging or discharging of the capacitor 48 through the grid coupling resistor of the succeeding stage. Due to the time constant of such charging circuit, the grid of the succeeding stage would be held at a different potential from the normal value for a certain time interval, and in some instances where a great change in the gain is being brought about, the grid of the succeeding stage may be driven so far from normal as to greatly distort or substantially block the transmission of seismic wave signals.

Figure 5:
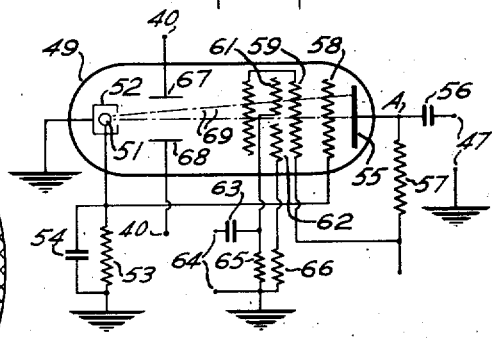
Fig. 5 shows another vacuum tube arrangement and circuit therefor.

From the foregoing it is apparent that a gain control element can be utilized to deflect an electron beam away from the signal grid and that another path for the electron beam may be provided which has the same impedance so that the anode current remains substantially constant. Another form of vacuum tube structure operating in the same manner is illustrated in Fig. 5 wherein there is provided a vacuum tube 49 having a cathode 51 provided with an electron beam focusing element 52. The beam focusing element 52 may be connected to ground, and the cathode 51 may be self-biased by a resistor 53 which is by-passed by a capacitor 54. The vacuum tube has an anode 55 which is coupled by a capacitor 56 to an output terminal. The anode 55 is connected through an anode circuit resistor 57 to a suitable source of potential. A suppressor grid 58 located adjacent the anode 55 is connected to the cathode 51. The screen grid structure 59 surrounds a pair of grids. One grid 61 serves as a signal grid and the other grid 62 serves as a non-signal grid. The signal grid 61 is connected by a coupling capacitor 63 to one terminal of a pair of signal input terminals 64. The grid 61 is provided with a grid circuit resistor 65 which is connected to ground. The non-signal grid 62 is provided with a similar grid resistor 66 also connected to ground. Between the cathode 51 and the grids 59, 61 and 62 there are located a pair of deflecting plates 67 and 68. These deflecting plates are connected to a gain control voltage 40 so that the plates shift the direction of an electron beam 69 either upwardly or downwardly as seen in the circuit diagram of Fig. 5. When the beam is deflected upwardly by suitable potential upon the plates 67 and 68, the principal energy of an electron beam passes through the signal grid 61. When the beam is deflected to a similar position downwardly, the electron beam does not strike the signal grid 61 but passes through the non-signal grid 62. At intermediate positions, the electron beam 69 will engage portions of both of the grids 61 and 62. Thus, a gain control potential may be applied to the vacuum tube 49 *to change in one sense the engagement of the electron beam with the signal grid 61 while changing by an equal amount and in an opposite sense the engagement of the beam with the non-signal grid 62* to maintain substantially constant the signal potential at the point A of the anode circuit which is coupled by the capacitor 56 to the succeeding stage of amplification.

Figure 6:
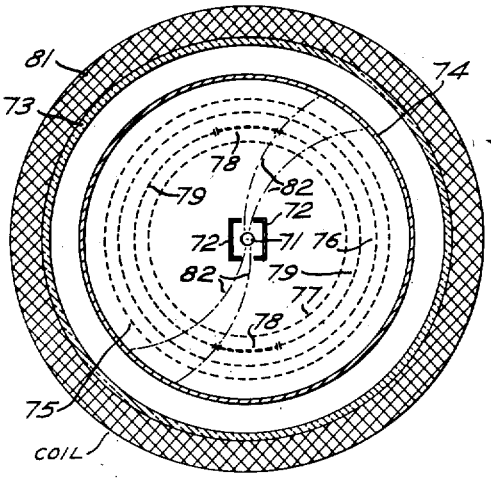
Fig. 6 is another diagrammatic representation of still a different form of vacuum tube having the operating characteristics of the present invention.

Still another vacuum tube structure operating in accordance with the principles of the present invention is illustrated in Fig. 6 wherein the vacuum tube is provided with a cathode 71 surrounded by an electron beam forming structure 72. An envelope 73 surrounds a cylindrical anode 74. A suppressor grid 75 is located concentric to the anode 74. Suitable screen grid structures 76 and 77 are provided to surround a pair of signal grids 78 and a pair of non-signal grids 79. Surrounding the envelope 73 is an electromagnetic coil 81. An application of a control voltage to the magnetic coil 81 will cause a displacement of an electron beam 82 much in the manner illustrated in Fig. 6. The degree of deflection may vary from the maximum illustrated in the figure to zero so that all or no part of the electron beam impinges upon the pair of signal grids 78. Since the impedance presented to the electron beam path of the electron beam 82 is constant at all times, the constant anode current will flow and yet with respect to the signal grid the tube will have a variable mu characteristic.

While the foregoing vacuum tube arrangements have for the purpose of illustration been described as being particularly adapted for the requirement of gain control in seismographic amplifiers, it is to be understood that such vacuum tubes have many other applications. For example, the vacuum tube might be used in a balanced modulator using a single-ended resistance-capacitance coupling capable of operating at a wide range of frequencies and which would incorporate all the advantages of modulators of the prior art which, however, have required the use of push-pull circuits and transformer couplings. In explaining the operation and structure of the vacuum tubes, it furthermore has been convenient to designate one of the grids as a signal grid and the other grid as a non-signal grid, but it will be appreciated that different signals might be applied to each of the grids as is often the case in communication systems. For example, it may be desired to fade from one signal channel to another as in the case of radio or television communication. In still other instances, it might be desirable to establish a particular balance between the levels of two signals applied to the grids. The particular balance selected might control the circuit to cause the application of the gain control voltage to apply a corrective or compensating effect in accordance with the difference in signal levels on the two sets of grids.

While for the purpose of explanation of the present invention certain specific embodiments and structural arrangements have been shown in the drawing, it is to be understood that the invention is not to be limited thereby since such variations in the elements employed and in their arrangements are contemplated as may be commensurate with the spirit and scope of the invention defined in the following claims.

What is claimed is:

[1. An electron beam vacuum tube having a cathode, electron beam forming means, a signal grid, a screen grid, a suppressor grid, an anode, and electrostatic means between said cathode and said signal grid for deflecting the electron beam away from said signal grid while maintaining said anode current substantially constant.]

[2. An electron beam vacuum tube having an anode, two grids located equidistant from the cathode, electron beam-forming means, and electrostatic means intermediate said cathode and said grids for deflecting the electron beam through a range extending from one of said grids to the other without substantial change of said anode current.]

[3. A vacuum tube having an anode, a suppressor grid, a cathode, means for forming an electron beam, two grids located equidistant from the cathode, a screen grid, and an electrostatic electrode located between said cathode and said two grids in the normal path of the electron beam.]

[4. A vacuum tube having a cathode, an anode, a suppressor grid, a screen grid, two grids located equidistant from the cathode, means for forming an electron beam, and electrostatic plates within said tube and between said cathode and said grids for deflecting the electron beam from one grid to the other of said two grids.]

[5. A vacuum tube having an anode, a cathode, a suppressor grid, a screen grid, two grids located equidistant from the cathode, means forming an electron beam, and electrostatic means within said tube for deflecting the electron beam from one grid to the other of said two grids.]

[6. A vacuum tube having an anode, a cathode, a suppressor grid, a screen grid, a signal grid and a non-signal grid respectively located equidistant from the cathode, means for forming an electron beam, and means for deflecting the electron beam from one grid to the other of said grids to change the proportion of said beam affected by said signal grid, said means including a pair of electrostatic plates positioned between said beam-forming means and said grids.]

[7. An electron beam vacuum tube having an anode, two grids located equidistant from the cathode, and means disposed between said cathode and said grids for deflecting the path of the electron beam from one grid to another thereby to produce relative to one of the grids a variable transconductance characteristic without varying substantially said anode current of said tube.]

[8. An electron beam vacuum tube having a cathode, an anode, means for forming an electron beam between them, a signal grid having a structure through which electrons may pass interposed in the path of said beam, and structure within said tube between said cathode and said signal grid adjacent said beam for deflecting said electron beam away from said signal grid upon application of a potential to said structure, the anode current remaining substantially constant for any degree of deflection of said beam.]

*9. An electron beam vacuum tube having a cathode, an anode, electron beam forming means for establishing an electron beam between said cathode and said anode, a suppressor grid adjacent said anode, a pair of screen grids, a signal grid and a non-signal grid disposed between said screen grids, said signal grid and non-signal grid being equidistant from said cathode but electrically insulated one from the other, and electrostatic means between said cathode and that one of said screen grids on the cathode side of said signal for changing the position of the electron beam relative to said signal grid and non-signal grid to change in one sense the engagement of said beam with said signal grid while simultaneously changing in the opposite sense and by an equal amount the engagement of said beam with said non-signal grid.*

*10. An electron beam vacuum tube having a cathode, a single anode, two screen grids adjacent said anode, electron beam forming means for establishing an electron beam between said cathode and said anode, a signal grid and a non-signal grid disposed between said screen grids, said signal grid and said non-signal grid being equidistant from said cathode but electrically insulated one from the other, and means intermediate said cathode and said screen grids for deflecting said electron beam through a range extending from one of said grids to the other without substantial change of said anode current.*

*11. A vacuum tube having a cathode, an anode, a suppressor grid adjacent said anode, electron beam forming means for establishing an electron beam between said cathode and said anode, a pair of screen grids, two control grids located equidistant from said cathode and intermediate said screen grids, and an electrostatic electrode located between said cathode and said screen grids in the normal path of the electron beam to change in one sense the engagement of said beam with one of said control grids while simultaneously changing in the opposite sense and by an equal amount the engagement of said beam with the other of said control grids.*

*12. A vacuum tube having a cathode, a single anode, a pair of screen grids forming a screened zone between said anode and said cathode, electron beam forming means for establishing an electron beam between said cathode and said anode, two control grids located equidistant from said cathode and in said zone and electrically insulated one from the other, and electrostatic plates within said tube and between said cathode and said screen grids for deflecting said electron beam from one control grid to the other to change in one sense the engagement of said beam with a first of said control grids while simultaneously changing in the opposite sense and by an equal amount the engagement of said beam with the other of said control grids.*

*13. A vacuum tube having a cathode, an anode, a suppressor grid adjacent said anode, a pair of screen grids positioned between said cathode and said suppressor grid to establish a screened zone, two control grids located equidistant from said cathode in said screened zone, means for forming an electron beam between said cathode and said anode, and electrostatic means within said tube for deflecting the electron beam from one of said control grids to the other.*

*14. A vacuum tube having a cathode, an anode, a suppressor grid adjacent said anode, a pair of screen grids intermediate said cathode and said suppressor grid for establishing a screened zone, two control grids located equidistant from said cathode in said screened zone, electron beam forming means for establishing an electron beam between said cathode and said anode, and means for deflecting said electron beam from one control grid to the other control grid to change the proportion of said beam effected by said control grids, said means including a pair of electrostatic plates positioned between said electron beam forming means and said screen grids.*

*15. An electron beam vacuum tube having a cathode, a single anode, a pair of screen grids for establishing a screened zone between said cathode and said anode, two control grids located equidistant from said cathode and disposed in said zone between said screen grids, and means disposed between said cathode and said screen grids for deflecting the path of the electron beam from one control grid to another thereby to produce relative to one of the control grids a variable transconductance characteristic without varying substantially the anode current of said tube.*

*16. An electron beam vacuum tube having a cathode, a single anode, means for forming an electron beam between them, a pair of circumferentially continuous screen grids for establishing a screened zone between said cathode and said anode, a signal grid having a structure through which said electrons may pass interposed in said zone intermediate said screen grids in the path of said beam, and structure within said tube between said cathode and said screen grids adjacent said beam for deflecting said beam away from said signal grid upon application of a potential to said structure, the anode current remaining substantially constant for any degree of deflection of said beam.*

*17. A vacuum tube having a cathode, a single anode, a pair of cylindrical screen grids forming a screened zone between said anode and said cathode, electron beam forming means for establishing an electron beam between said cathode and said anode, two control grids located equidistant from said cathode and in said zone and electrically insulated one from the other, and electrostatic plates within said tube and between said cathode and said screen grids for deflecting said electron beam from one control grid to the other to change in one sense the engagement of said beam with a first of said control grids while simultaneously changing in the opposite sense and by an equal amount the engagement of said beam with the other of said control grids.*

*18. An electron beam vacuum tube having a cathode, a single anode, a pair of cylindrical screen grids for establishing a screened zone between said cathode and said anode, two control grids located equidistant from said cathode and disposed in said zone between said screen grids, and means disposed between said cathode and said screen grids for deflecting the path of the electron beam from one control grid to another thereby to produce relative to one of the control grids a variable transconductance characteristic without varying substantially the anode current of said tube.*

*19. A vacuum tube comprising a cathode, a pair of cylindrical screen grids forming a screened zone between them, electron beam-forming means for establishing an electron beam between said cathode and said screen grids, two control grids located equidistant from said cathode and in said*

*screened zone and electrically insulated one from the other, electrostatic plates within said tube and between said cathode and said control grids for deflecting said electron beam from one of them to the other to change in one sense the engagement of said beam with a first of them while simultaneously changing in the opposite sense and by an equal amount the engagement of said beam with the other of them, and an anode circumferentially coextensive with the extent of deflection of said beam for receiving said electron beam in all positions relative to said grids, whereby upon deflection of said beam relative to said control grids the average value of said anode current remains constant.*

GEORGE B. LOPER.

References Cited in the file of this patent or the original patent

UNITED STATES PATENTS

| Number | Name | Date |
|---|---|---|
| 2,107,333 | Jonker | Feb. 8, 1938 |
| 2,144,085 | Rothe et al. | Jan. 17, 1939 |
| 2,156,088 | Heising | Apr. 25, 1939 |
| 2,185,693 | Mertz | Jan. 2, 1940 |
| 2,219,102 | Herold | Oct. 22, 1940 |
| 2,225,689 | Demuth | Dec. 24, 1940 |
| 2,235,817 | Freeman | Mar. 25, 1941 |
| 2,314,302 | Ziebolz | Mar. 16, 1943 |
| 2,404,106 | Snyder | July 16, 1946 |

FOREIGN PATENTS

| Number | Country | Date |
|---|---|---|
| 378,559 | Italy | Feb. 15, 1940 |